United States Patent
Nystrom et al.

(10) Patent No.: US 9,738,070 B1
(45) Date of Patent: Aug. 22, 2017

(54) INTEGRATED PIEZO PRINTHEAD

(71) Applicant: Xerox Corporation, Norwalk, CT (US)

(72) Inventors: Peter J. Nystrom, Webster, NY (US);
Angus Ian Kingon, Warren, RI (US);
Andrew W. Hays, Fairport, NY (US);
Seunghyun Kim, Bristol, RI (US)

(73) Assignees: Xerox Corporation, Norwalk, CT (US); Brown Universersity, Providence, RI (US)

(*) Notice: Subject to any disclaimer, the term of this patent is extended or adjusted under 35 U.S.C. 154(b) by 0 days.

(21) Appl. No.: 15/141,229

(22) Filed: Apr. 28, 2016

(51) Int. Cl.
*B41J 2/045* (2006.01)
*B41J 2/14* (2006.01)

(52) U.S. Cl.
CPC .................. *B41J 2/14233* (2013.01)

(58) Field of Classification Search
CPC  B41J 2/14201; B41J 2/14233; B41J 2/14274; B41J 2/14314
See application file for complete search history.

(56) References Cited

U.S. PATENT DOCUMENTS

| | | | |
|---|---|---|---|
| 6,158,847 A * | 12/2000 | Usui | B41J 2/14233 347/70 |
| 6,514,427 B2 | 2/2003 | Nishida et al. | |
| 6,955,419 B2 | 10/2005 | Andrews et al. | |
| 6,987,348 B2 | 1/2006 | Buhler et al. | |
| 7,048,361 B2 | 5/2006 | Schmachtenberg, III et al. | |
| 7,965,021 B2 | 6/2011 | Harigai et al. | |
| 8,183,748 B2 | 5/2012 | Harigai et al. | |
| 8,288,020 B2 | 10/2012 | Harigai et al. | |
| 8,390,179 B2 | 3/2013 | Harigai et al. | |
| 8,393,719 B2 | 3/2013 | Harigai et al. | |
| 2004/0164650 A1* | 8/2004 | Xu | B41J 2/161 310/328 |
| 2007/0008388 A1 | 1/2007 | Yamaguchi et al. | |

(Continued)

FOREIGN PATENT DOCUMENTS

| JP | 009105331 | 12/1995 |
|---|---|---|
| WO | WO 2011/129072 A1 | 10/2011 |

(Continued)

OTHER PUBLICATIONS

U.S. Appl. No. 14/851,422, filed Sep. 11, 2015, Hays et al.

*Primary Examiner* — Juanita D Jackson
(74) *Attorney, Agent, or Firm* — Fay Sharpe LLP

(57) ABSTRACT

An apparatus for a piezoelectric ink-jet printhead is disclosed. Piezoelectric printheads, while more expensive are favored because they use a wider variety of inks. The piezoelectric printhead includes a plurality of ink ejectors with a nozzle, an ink chamber, at least one body chamber, at least one diaphragm material, and a top electrode. The diaphragm material consists of a foil with built up piezoelectric material. The deflection of the diaphragm on the body chamber contributes to a pressure pulse that is used to eject a drop of liquid from the nozzle. According to an exemplary embodiment disclosed, a thin-film piezoelectric printhead uses existing low-cost adhesive based jet stack fabrication processed with polymers and metal foil layers and avoids the cost and complexity of a Micro-electrical-mechanical (MEMS) based fabrication system. According to another exemplary embodiment of this disclosure, provided is a thick hybrid film piezoelectric printhead.

20 Claims, 7 Drawing Sheets

(56) References Cited

U.S. PATENT DOCUMENTS

| | | |
|---|---|---|
| 2012/0038714 A1 | 2/2012 | Harigai et al. |
| 2012/0281046 A1 | 11/2012 | Harigai et al. |
| 2013/0136951 A1 | 5/2013 | Harigai et al. |
| 2013/0155155 A1 | 6/2013 | Furihata |
| 2013/0162708 A1 | 6/2013 | Hanagami |
| 2013/0169716 A1 | 7/2013 | Konishi |
| 2013/0222482 A1 | 8/2013 | Kubota et al. |

FOREIGN PATENT DOCUMENTS

| | | |
|---|---|---|
| WO | WO 2011/158491 A1 | 12/2011 |
| WO | WO 2012/104945 A1 | 8/2012 |

* cited by examiner

INTEGRATED PIEZO PRINTHEAD

CROSS REFERENCE TO RELATED PATENTS AND APPLICATIONS

U.S. patent application Ser. No. 14/851,422 filed Sep. 11, 2015 entitled "INTEGRATED THIN FILM PIEZOELECTRIC PRINTHEAD", is incorporated herein by reference in its entirety.

TECHNICAL FIELD

The present application is related to the field of ink jet printing devices and more particularly to methods and structures for an integrated piezoelectric ink jet print head.

BACKGROUND

Drop on demand ink jet technology is widely used in the printing industry. Printers using drop on demand ink jet technology may use a plurality (i.e., an array) of electrostatic actuators, piezoelectric actuators, or thermal actuators to eject ink from a plurality of nozzles in an aperture plate (nozzle plate). Even though they are more expensive to manufacture than thermal ink jets, piezoelectric ink jets are generally favored, for example because they can use a wider variety of inks.

Piezoelectric ink jet print heads include an array of actuators (i.e., piezoelectric elements or transducers). One process to form the array includes detachably bonding a blanket or bulk piezoelectric layer including a lead zirconate titanate composition to a transfer carrier with an adhesive, and dicing the blanket piezoelectric layer to form a plurality of individual piezoelectric elements. A plurality of dicing saw passes can be used to remove all the piezoelectric material between adjacent piezoelectric elements to provide the correct spacing between each piezoelectric element.

Piezoelectric ink jet print heads can typically further include a flexible diaphragm to which the array of piezoelectric elements is bonded, for example with an epoxy adhesive. The diaphragm may be a metal layer that functions as a lower electrode that is common to a plurality of actuators, or a non-metal layer coated with a metal layer that provides an individual, electrically conductive lower electrode for each actuator. When a voltage is applied across one of the actuators, the actuator bends or deflects, causing the diaphragm to flex which expels a quantity of ink from a chamber through a nozzle. The flexing further draws ink into the chamber from a main ink reservoir through an opening to replace the expelled ink.

The bulk piezoelectric composition can have a thickness from about 2 mils to 4 mils (50 micrometers, µm, to 100 µm), and a stainless steel diaphragm having a thickness that is from about 20 µm to 50 µm thick. The bulk piezoelectric layer can be diced into square or parallelogram shapes to conform to square or parallelogram body chambers. During printing, ink is ejected from the body chambers through the nozzles in the aperture plate.

Increasing the printing resolution of an ink jet printer employing piezoelectric ink jet technology is a goal of design engineers. One way to increase the jet density is to increase the density of the actuators. In one implementation, a thin film actuator array may be bonded to relatively long and narrow body chambers to insure robustness of the diaphragm and to control vibrational modes of the diaphragm.

Forming relatively small, thin actuators and subsequently attaching them to a diaphragm becomes more difficult with decreasing actuator sizes and thicknesses. While microelectronic fabrication of printhead structures would provide precise control of resulting structures, such methods are volume sensitive and capital intensive which may preclude their use for low volume or custom products.

Current thin film piezoelectric systems utilize a much thinner diaphragm, on the order of 1 to 3 µm. Because of this it is desirable to have a relatively long, thin body chamber to insure robustness of the diaphragm and to control the vibrational modes of the diaphragm. Further, current thin film printhead fabrication processes generally use silicon wafers or quartz/glass panels in a microelectronic fabrication process to achieve the process control required for such films. Microelectronic processing can be volume sensitive and capital intensive. This can preclude its use for low volume or custom products.

A method for precise formation of thin film actuators and an associated printhead structure is desirable.

There is also a need to fabricate high quality BNKT-BMT thick films in the range of 5-50 µm which will cover the important commercial technological gap between the thin films and the bulk ceramics. Conventional tape casting and screen printing techniques have been widely used for preparing piezoelectric thick films, which generally require high temperature annealing or sintering process above 1000° C. Unfortunately, such an extremely high temperature is unacceptable for the membrane metal substrate due to a severe chemical reaction and oxidation of the substrate materials. Therefore, extensive efforts have previously focused on reducing sintering temperature of the thick films using sintering aids in the slurry or the paste.

However, sintering aids have induced the formation of a second non-piezoelectric phase in the final sintered films, which can lead to a substantial damaging effect on the electrical and physical properties of the films and usually need to process under reducing conditions to match the temperature limits of the substrates.

To solve these drawbacks, provided herein is a simple process for high quality BNKT-BMT thick films using a chemical solution modified hybrid deposition technique, that is, the use of multiple infiltration process using the same composition BNKT-BMT solution without any additional sintering aids. As further discussed in the detailed description below, with this technique, the annealing temperature of the thick films is lowered to 700° C. with much enhanced piezoelectric performance of the films.

INCORPORATION BY REFERENCE

The following references, the disclosures of which are incorporated herein by reference in their entireties, are mentioned:

U.S. Pat. No. 6,955,419, issued Oct. 18, 2005, by Andrews et al., entitled "INK JET APPARATUS";

U.S. Pat. No. 6,987,348, issued Jan. 17, 2006, by Buhler et al., entitled "PIEZOELECTRIC TRANSDUCERS";

U.S. Pat. No. 7,048,361, issued May 23, 2006, by Schmachtenberg, III et al., entitled "INK JET APPARATUS"; and U.S. patent application Ser. No. 14/851,422 filed Sep. 11, 2015 entitled "INTEGRATED THIN FILM PIEZOELECTRIC PRINTHEAD", are incorporated herein by reference in their entirety.

BRIEF DESCRIPTION

In one embodiment of this disclosure, described is a piezoelectric ink-jet printhead comprising: a plurality of ink ejectors including, a nozzle; an ink chamber; at least one body chamber; at least one diaphragm material, wherein the diaphragm material consists of a foil with built up piezoelectric material, configured such that the deflection of the diaphragm on the at least one body chamber contributes to a pressure pulse that is used to eject a drop of liquid from the nozzle; and a top electrode, the top electrode being individually addressable through drive electronics in electrical communication with the top electrode.

In another embodiment of this disclosure, described is a piezoelectric ink-jet printhead comprising: a plurality of ink ejectors including, a nozzle; an ink chamber; at least one body chamber; at least one diaphragm material, wherein the diaphragm consists of a foil with built up piezoelectric material, configured such that the deflection of the diaphragm on the at least one body chamber contributes to a pressure pulse that is used to eject a drop of liquid from the nozzle; and a top electrode, the top electrode individually addressable through drive electronics in electrical communication with the top electrode; wherein the piezoelectric printhead is formed by depositing a liquid sol-gel solution comprising a piezoelectric material over a substrate; curing the liquid sol-gel solution on the substrate to form a cured piezoelectric composite; and forming an actuator array for the ink jet printhead from the piezoelectric composite, wherein the actuator array comprises a plurality of individually addressable actuators.

In still another embodiment of this disclosure, described is a method for fabricating BNKT-BMT thick hybrid films, the method comprising: deposition of a BNKT-BMT paste on a stainless steel membrane substrate using screen printing or any other method of applying the paste, wherein the deposited BNKT-BMT paste is then cured; and infiltration of the BNKT-BMT paste solution having the same composition as the screen printed films, wherein the infiltrated BNKT-BMT paste is cured, wherein after 10-40 infiltrations and curing cycles, a thick hybrid film is annealed at 650° C.-800° C. for 30 minutes to 2 hours with a final thickness in the range of 5 μm-50 μm.

BRIEF DESCRIPTION OF THE DRAWINGS

The exemplary embodiments may take form in various components and arrangements of components, and in various steps and arrangements of steps. The drawings are only for purposes of illustrating the preferred embodiments and are not to be construed as limiting the present exemplary embodiment.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary embodiments of the present teachings, examples of which are illustrated in the accompanying drawings. Wherever possible, the same reference numbers will be used throughout the drawings to refer to the same or like parts.

As used herein, unless otherwise specified, the word "printer" encompasses any apparatus that performs a print outputting function for any purpose, such as a digital copier, bookmaking machine, facsimile machine, a multi-function machine, electrostatographic device, etc.

According to an exemplary embodiment described herein, provided is a relatively thin-film piezo driver system that retains the use of existing low-cost adhesive based jet stack fabrication processes with polymers and metal foil layers. This approach avoids the cost and complexity of a MEMS based fabrication process. The piezoelectric material is deposited and built up directly on a foil using methods such as spin on or even spray solution techniques. These solutions can include a variety of Sol Gel chemistries, often built up layer by layer. This is in contrast to a traditional thick film technique where paste-like films are placed on a substrate via screen or stencil printed and fired as one layer.

According to another exemplary embodiment described herein, provided is a thick film piezo driver system where a paste-like film is applied to a metal foil layer substrate which functions as a diaphragm.

By applying the piezo material directly to the raw foil, or precut foil pieces, standard print head manufacturing techniques may be utilized without significant change.

The foil which acts as a diaphragm can also act as a common electrode, often ground, while the top signal electrode can be formed by a wide variety of methods, including, but not limited to, sputtered and plated metal films, printed conductive electrodes, and blanket films, patterned or directly written.

The foil layer substrate with the piezo material is bonded to the remainder of the jetstack as part of a final lamination process. According to an exemplary embodiment, addressing individual elements is accomplished by a number of means including blanket metal scribed or etched to singulate actuators, or the metal can be patterned to form electrodes directly.

Extensions of the disclosed method and device to integrate a piezo material into a foil substrate, for use as a printhead, include 1) continuous processing, where coils or webs of diaphragm stock are coated with piezo material and processed in a reel to reel fashion; 2) near net shape where punched or etched diaphragms are formed singly or in sheets and have piezo material processed directly onto them.

Figure 1:
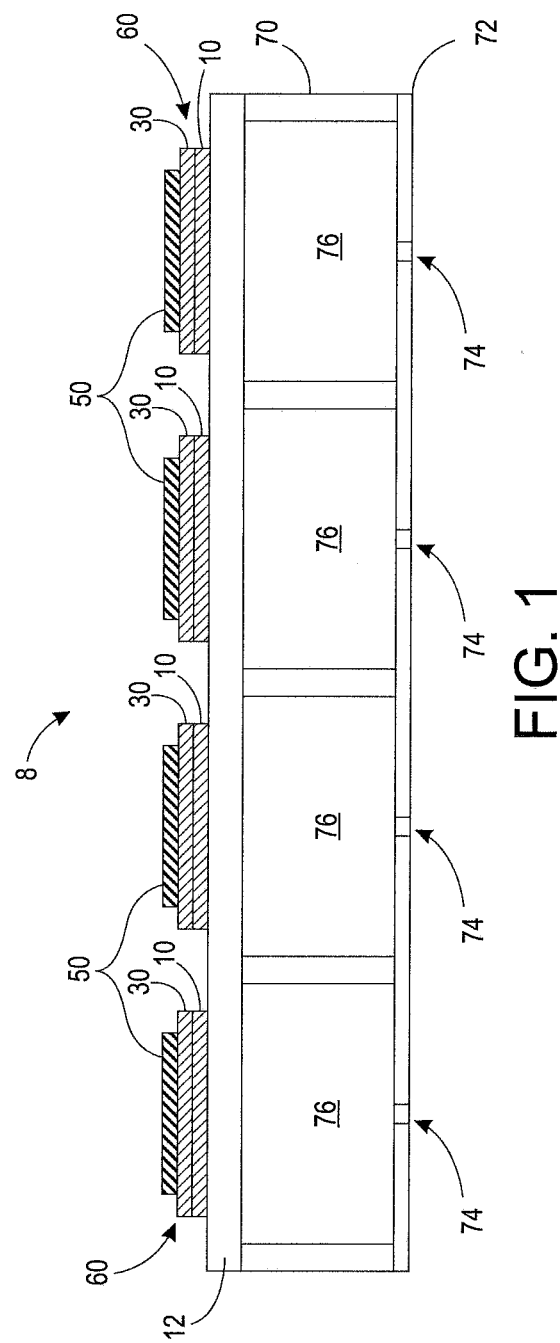
FIG. 1 depicts as exemplary embodiment of a piezoelectric printhead.

Forming relatively small, thin actuators and subsequently attaching them to a diaphragm becomes more difficult with decreasing actuator sizes and thicknesses. With reference to FIG. 1, an exemplary embodiment of the present disclosure is provided including a structure for forming an actuator array driver system directly on a substrate, a diaphragm, or, specifically, a printhead structure.

As shown in FIG. 1, provided is a piezo printhead array structure 8, the structure including ink chambers 76 enclosed with walls 70, aperture plate 72 and a foil substrate 12 which functions as a diaphragm to expel ink from nozzles 74. Each individual actuators 60 is attached to the foil substrate 12 and includes a top plate 50, a first sol-gel layer 10 and a second sol-gel layer 30.

During operation of the piezo printhead array structure, a voltage is applied between the top plate 50 acting as an electrode and foil substrate 12 acting as a common electrode for the printhead actuators 60, which energizes the sol-gel layers 10 and 30, i.e., piezoelectric material, to expand the foil substrate, i.e., diaphragm, to expel ink droplets from nozzles 74.

Figure 2:
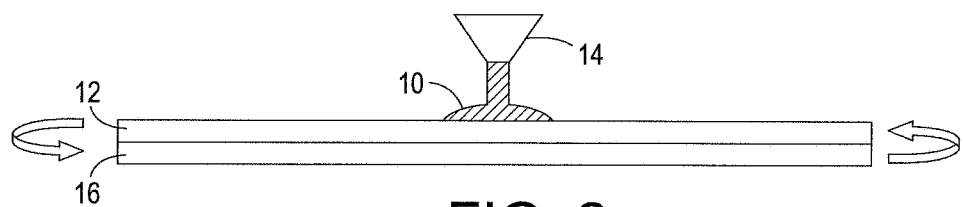
FIGS. 2-8 are cross sections depicting an embodiment of the present teachings to form a piezoelectric ink jet printhead.

FIGS. 2-7 are cross sections depicting various in-process structures that can be formed during an embodiment of the present teachings. It will be understood that the FIGS. are generalized schematic depictions and that a structure in accordance with an embodiment may include other substructures that are not depicted for simplicity, while various depicted substructures may be removed or modified. FIG. 2 illustrates the deposition of a liquid actuator material 10 onto a substrate 12 from a dispenser 14. The dispenser 14 may be a spin coat apparatus that includes, for example, a chuck or platform 16 that positions the substrate 12 and rotates the substrate 12. Other dispensers are also contemplated including, but not limited to, a spray coating apparatus and a dip coating apparatus.

The substrate 12 may be a printhead diaphragm that will be subsequently attached to a printhead jet stack as described below. The diaphragm may be removably attached to a supporting substrate during formation of the piezoelectric layer. In another embodiment, during formation of the piezoelectric electric layer, the diaphragm may already be attached to a portion of the printhead jet stack such that the substrate 12 includes the printhead diaphragm and jet stack, and FIG. 2 depicts depositing the actuator material 10 onto a printhead diaphragm that is attached to a printhead jet stack. In another embodiment as described below, the substrate 12 may be a transfer layer that is not present in the final printhead structure.

According to an exemplary embodiment, the material foil diaphragm 12 thickness is from 500 nm (0.5 µm) and 30,000 nm (30 µm).

In an embodiment, the actuator material 10 may be a liquid, chemically stable sol-gel solution or composite that includes a piezoelectric material in an appropriate solution. For example, the sol-gel solution can include from about 0.3 moles per liter (mol/L) to about 0.7 mol/L of the piezoelectric material, wherein the piezoelectric material includes a Bi—Na—K—Ti—O oxide (i.e., an oxide that may be of the composition $Bi_vNa_wK_xTi_yO_z$, where the values of v-z are as described below, or another form). In solution, the prescribed elements are present as solubilized molecular precursors. In addition to Bi—Na—K—Ti—O oxide, the piezoelectric material may further include a Bi—Mg—Ti—O oxide (i.e., an oxide that may be in the form in the form $Bi_aMg_bTi_cO_d$, where the values of a-d are as described below, or another form). Measured as a weight percent (wt %), the sol-gel solution can include the piezoelectric material, either Bi—Na—K—Ti—O or a mixture of Bi—Na—K—Ti—O and Bi—Mg—Ti—O (i.e., Bi—Na—K—Ti-O+Bi-Mg—Ti—O) in a range of from about 15 wt % to about 40 wt % of the piezoelectric sol-gel solution.

The molecular precursors of the piezoelectric material solute are mixed with a sufficient amount of solvent and, optionally, any additional materials as described herein, such that the piezoelectric material has a concentration of from about 0.3 mol/L to about 0.7 mol/L. The solvent may include one or more of butanol (i.e., butyl alcohol, $C_4H_9OH$), ethanol (i.e., ethyl alcohol, $C_2H_5OH$), methanol (i.e., methyl alcohol, $CH_3OH$), isopropanol (i.e., isopropyl alcohol, $C_3H_7OH$) and 2-methoxyethanol (i.e., methyl cellulose, $C_3H_8O_2$). Other alcoholic solvents are contemplated. The sol-gel solution may have a viscosity in the range of from about 4.0 centipoise (cP) to about 8.0 cP.

The sol-gel solution may be prepared using various techniques. In one exemplary technique, Bi, Na, K, and Ti precursors may be mixed within the solvent and then reacted together to form the sol-gel. The oxygen component to form the $Bi_vNa_wK_xTi_yO_z$ oxide piezoelectric material is provided by the molecular precursors. If the sol-gel is to also include $Bi_aMg_bTi_cO_d$, then Bi, Mg, and Ti precursors may be subsequently mixed in the Bi—N—K—Ti—O solution, forming a $Bi_vNa_wK_xTi_yO_z$—$Bi_aMg_bTi_cO_d$ solid solution during the subsequent annealing process described below. The oxygen component to form the $Bi_aMg_bTi_cO_d$ oxide piezoelectric material is provided by the molecular precursors.

In another embodiment, two separate solutions can be prepared. For a first solution, Bi, Na, K, and Ti precursors may be mixed within a solvent and then reacted together to form a first sol-gel component. For a second solution, Bi, Mg, and Ti precursors may be mixed within a solvent and the reacted together to form a second sol-gel component. Subsequently, the first sol-gel component and the second sol-gel component are mixed together to form the sol-gel.

Figure 3:
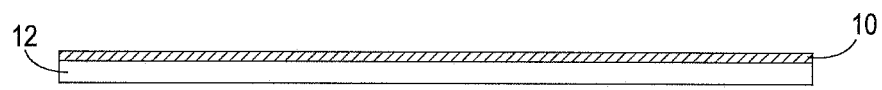

The sol-gel solution may be dispensed at a temperature of from about room temperature (i.e., about 20° C.) to about 100° C. During deposition of the sol-gel solution 10 onto the substrate 12, the substrate 12 can be rotated by the spin coat apparatus 14 to form a thin sol-gel layer 10 having a relatively uniform thickness as depicted in FIG. 3. During formation of the sol-gel layer, the substrate 12 may be rotated at a speed of from about 2500 rotations per minute (rpm) to about 3500 rpm, or from about 2750 rpm to about 3250 rpm, or about 3000 rpm. Rotation can be performed for a duration sufficient to thin the sol-gel layer 10 to a thickness of between about 50 nanometers (nm) for each coating layer and about 200 nm for each coating layer. Multiple coating layers may be applied as described below to form a final structure having a desired thickness.

Subsequently, the sol-gel layer 10 is subjected to a first curing process to partially or completely dry the sol-gel layer to remove at least part of the solvent component. The first curing process, and subsequent curing processes as described below, may include a drying process that heats the sol-gel layer using one or more of a sintering process, a pyrolizing process, a calcination process, and/or an annealing process. The molecular precursors react during this high temperature processing to result in the final oxide piezoelectric of the desired composition.

In an embodiment, the sol-gel layer 10 of FIG. 3 can be heated to a first temperature of from about 400° C. to about 500° C., or from about 425° C. to about 475° C., or to about 450° C. The first temperature can be maintained for from about 4 minutes to about 10 minutes, or from about 6 minutes to about 8 minutes, for example about 7 minutes. Subsequently, the sol-gel layer 10 can be heated to a second temperature of from about 600° C. to about 700° C., or from about 625° C. to about 675° C., or to about 650° C. The second temperature can be maintained for between about 1 minute and about 5 minutes, or from about 2 minutes to about 4 minutes, for example about 3 minutes.

Figure 4:
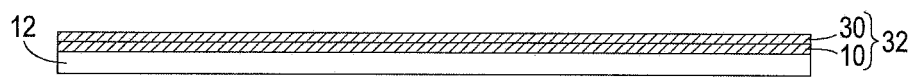

Next, the deposition and first curing processes described above can be repeated for a number of iterations sufficient to form a final actuator layer having a desired thickness to result in the structure of FIG. 4. While FIG. 4 depicts two sol-gel layers 10, 30 that together form an actuator layer laminate or composite 32 (hereinafter, a piezoelectric composite 32), it will be understood that any number of actuator layers can be formed during fabrication of the piezoelectric composite 32. For example, from about 5 layers to about 500 layers, or from about 5 layers to about 300 layers, or from about 5 layers to about 200 layers, or from about 10 layers to about 250 layers, or from about 10 layers to about 100 layers, or from about 15 layers to about 75 layers, or more than 10 layers, or more than 100 layers, or more that 250 layers, or more than 500 layers may be formed to make up the piezoelectric composite 32. In this embodiment, each sol-gel layer is formed directly on the previous partially or completely cured sol-gel layer with no intervening layers between, such that the piezoelectric composite includes at least two layers of piezoelectric material that physically contact each other. While the process and structure are described below with reference to a plurality of actuator layers, it will be understood that in another embodiment a single actuator layer 10 may be of a sufficient thickness that additional piezoelectric layers are not needed, in which case the piezoelectric composite refers to a single piezoelectric layer.

After the final piezoelectric layer is formed, the FIG. 4 structure is subjected to a second or final curing process to remove most or all of the solvent component of the sol-gel layers that form the piezoelectric composite 32. The final curing process can including heating the FIG. 4 structure to a temperature of from about 600° C. to about 700° C., or from about 625° C. to about 675° C., or to about 650° C. This temperature can be maintained for a duration of between about 20 minutes and about 40 minutes, or from about 25 minutes to about 35 minutes, for example about 30 minutes. After this final curing process, the resulting piezoelectric composite 32 can have a desired thickness, for example from 500 nm (0.5 µm) to about 25,000 nm (0.25 µm) or from about 500 nm (0.5 µm) to about 900 nm (0.9 µm), or from about 600 nm (0.6 µm) to about 800 nm (0.8 µm), or about 700 nm (0.7 µm). The chemical composition of the fully cured piezoelectric composite may include Bi—Na—K—Ti—O, in the form $Bi_vNa_wK_xTi_yO_z$, where "v" ranges from 0 to 0.5 (i.e., 0~0.5, where the range of the Bi component is from 0 to 0.5 mol), "w" is in the range of about 0.5~1, "x" is in the range of about 0~0.5, "y" is in the range of about 0.5~1 and "z" is in the range of about 1.5~3.5. In various embodiments, the Bi—Na—K—Ti—O may be modified with (i.e., mixed in solution with) Bi—Mg—Ti—O in the form $Bi_aMg_bTi_cO_d$, where "a" is in the range of from about 0.5~1, "b" is in the range of from about 0~0.5, "c" is in the range of from about 0~0.5, and "d" is in the range of from about 1.5~3.5.

An embodiment can include $1-y[Bi_{0.5}(Na_x, K_{1-x})TiO_3]+yBi(Mg_{0.5},Ti_{0.5})O_3$. In an embodiment, "x" may be in the range of from about 0.5~0.8 and "y" may range from about 0~0.1. In an embodiment, x=0.78 and y ranges from about 0~0.04. In an embodiment, x=0.78 and y=0.035, and the piezoelectric material oxides may be in the form $0.965Bi_{0.5}(Na_{0.78}K_{0.22})_{0.5}TiO_3+0.035Bi(Mg_{0.5}Ti_{0.5})O_3$ solid solution.

After forming the piezoelectric composite 32 as depicted in FIG. 4, printhead processing may continue to form a completed printhead. In one embodiment, an electrically conductive top electrode layer 40 can be formed on the exposed surface of the piezoelectric composite 32. In this embodiment, the top electrode layer 40 may be formed as a blanket layer as depicted. The top electrode layer 40 can be, for example, a metal such as copper, gold, titanium, nickel, or a metal alloy, or an electrically conductive non-metal, and may be formed to a thickness of from about 100 nm (0.1 µm) to about 1100 nm (1.1 µm). The top electrode layer 40 may be formed using sputtering, chemical vapor deposition, electroplating, or another suitable process.

Figure 5:
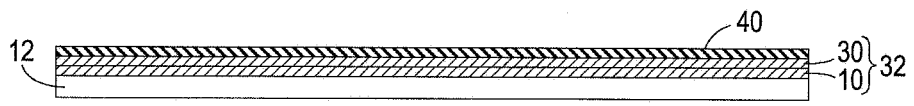
Figure 6:
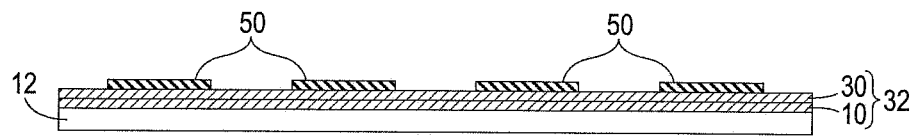

Next, the top electrode layer 40 is patterned to result in the array of individual top electrodes (i.e., top plates) 50 as depicted in FIG. 6. Patterning can be performed, for example, using a lithographic process that masks and chemically and/or mechanically etches a portion of the top electrode layer 40 to result in the top electrode array 50. In another embodiment, a laser ablation process may be used. In other embodiments, the plurality of top electrodes 50 can be directly formed, written, or printed onto the top of the FIG. 4 structure such that the individual patterning of blanket layer 40 of FIG. 5 is not necessary and processing bypasses the FIG. 5 structure and proceeds directly from FIG. 4 to FIG. 5.

Figure 7:
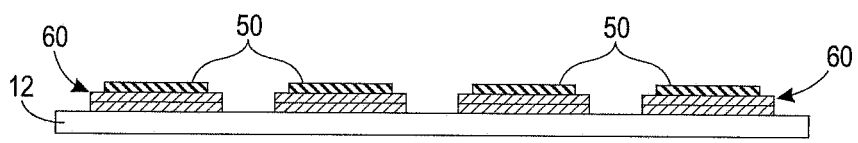

Next, the piezoelectric composite 32 is patterned as depicted in FIG. 7 to provide an array of individual actuators 60. The piezoelectric composite 32 can be patterned using, for example, lithography and chemical and/or mechanical etching, a dicing process using, for example, a dicing saw such as a wafer saw, or another process. In an embodiment, the substrate 12 may be used as an etch stop layer.

Figure 8:
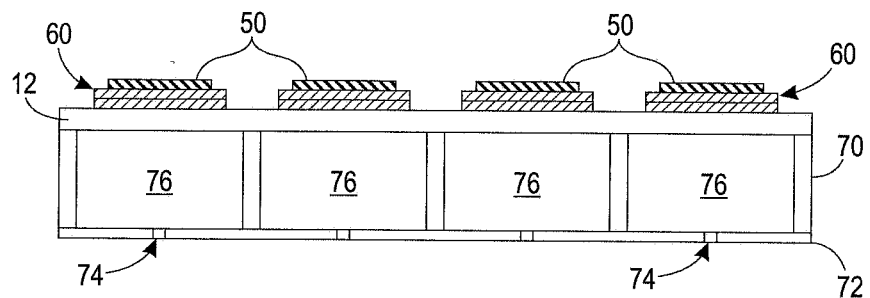

Subsequently, the substrate 12, in this embodiment the printhead diaphragm 12, is removed from the platform 16 (FIG. 2) if it has not already removed during prior processing. The printhead diaphragm 12, array of actuators 60, and array of top plates 50 are then bonded to a printhead jet stack using a suitable adhesive or other bonding technique, such as brazing, soldering, clamping, etc., as part of a final lamination process, ideally at a temperature to prevent damage to the material. The printhead jet stack may include a plurality of walls 70 and an aperture plate 72 having a plurality of nozzles 74 as depicted in FIG. 8. The walls 70, aperture plate 72, and diaphragm 12 may provide a plurality of ink chambers 76.

In this embodiment, a plurality of ink ejectors are formed in part by a nozzle 74, an ink chamber 76, the diaphragm 12, an actuator 60, and a top electrode 50. Each top electrode is individually addressable through drive electronics (not individually depicted for simplicity) in electrical communication with the top electrode 50, the diaphragm 12, and the actuator 60. The electrically conductive diaphragm 12 functions as a bottom electrode (i.e., bottom plate) that is common to a plurality of ejectors. During printing, ink 106 (FIG. 11) is ejected from the ink chambers 76 through the nozzles 74 in response to the application of a voltage between the top electrode 50 and the diaphragm 60. In response to the voltage, the associated actuator 60 bends or deflects, which deflects the diaphragm 60 over the associated ink chamber 76, and creates a pressure pulse in the ink chamber 76 to eject ink from the associated nozzle 74.

The preparation for BNKT-BMT thick hybrid films can be divided into two major steps: (1) the deposition of BNKT-BMT paste using a conventional screen printing method, or other method of applying paste such as syringe dispensing, material jetting, etc., on a stainless steel membrane substrate and subsequent drying at 250° C.-600° C. for 15 minutes to 1 hour, and (2) the infiltration of the BNKT-BMT solution having the same composition of the screen printed films or other lead-free piezoelectric solution, and drying in the range of 250° C.-600° C. for 5-20 minutes. After completion of infiltration and drying process, the hybrid films are finally annealed at 650°-800° C. for 30 minutes to 2 hours. The final field thickness of the hybrid and the screen printed films is in the range of 5-50 µm.

In the presence of a solution phase, a relatively rapid densification and grain growth of the screen printed film starts due to the capillary force exerted by the wetting solution on the solid particles in the early stage of the sintering process. In this stage, the grains are well packed and the interconnected pores become isolated, therefore the elimination of porosity proceeds with minimizing its surface energy. In addition, the infiltrated solution promotes easy crystallization, fast growth and densification due to easy coalescence of the grains, and homogenization without severe distortion or change of the grain shape inside the pores and at the grain boundaries of the film even at low annealing temperatures such at 700° C. for 30 minutes to 1 hour.

With reference to FIGS. 12-17, shown is a series of steps associated with producing a printhead structure using a piezo paste material according to an exemplary embodiment of this disclosure. According to the exemplary embodiment described, a stenciling process is used to apply the piezo paste; however, it is to be understood that the exemplary embodiment provided is not limited to a stenciling process, but can also include any other method of applying paste material.

Figure 12:
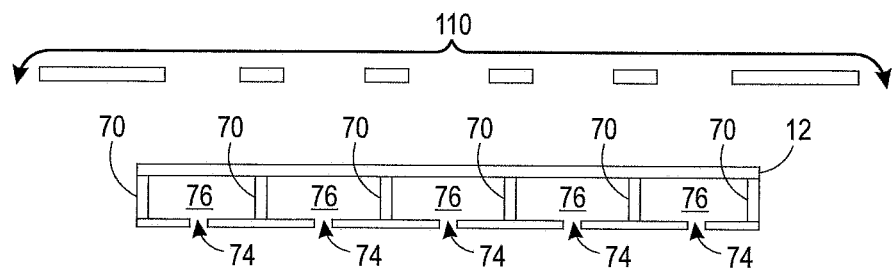
FIGS. 12-17 illustrate a series of step used to fabricate a piezoelectric printhead utilizing a stencil to apply a paste according to an exemplary embodiment of this disclosure.
Figure 13:
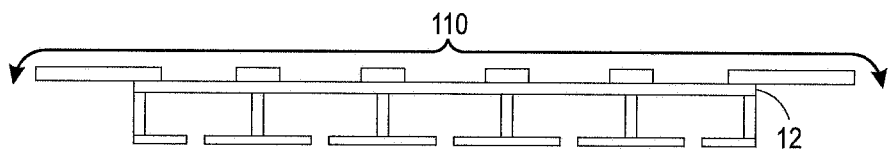

As shown in FIG. 12, initially a stencil 110 is provided which is brought into contact with a metal film substrate 12 as shown in FIG. 13.

Figure 14:
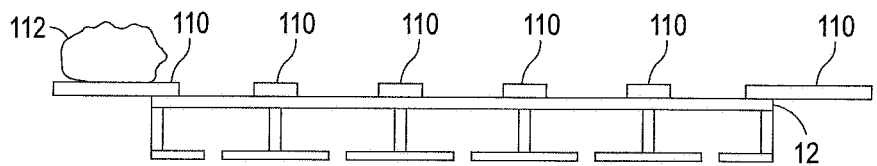
Figure 15:
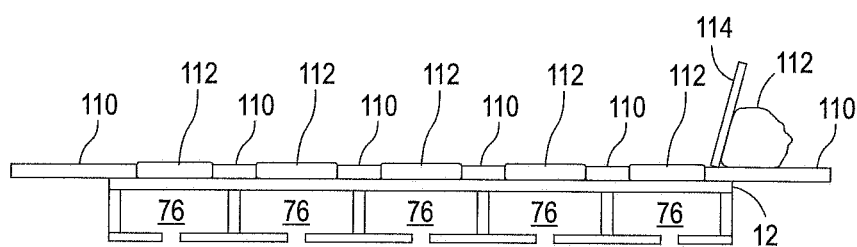

Next, as shown in FIG. 14, a piezo paste material 112 is deposited on the stencil 110 and squeezed across the stencil 110 as shown in FIG. 15, where the piezo paste material 112 is deposited on the foil substrate 12.

Figure 16:
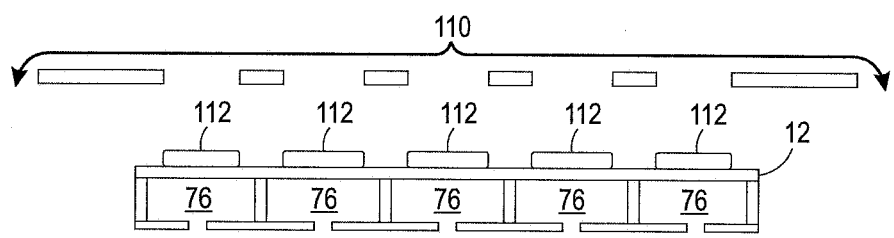
Figure 17:
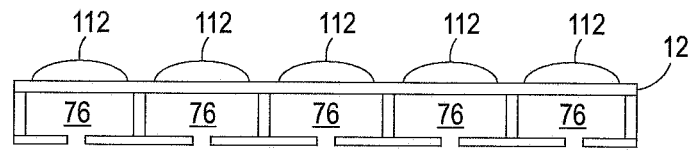

Next, as shown in FIG. 16, the stencil 110 is removed and the piezo paste is cured as shown in FIG. 17.

Figure 9:
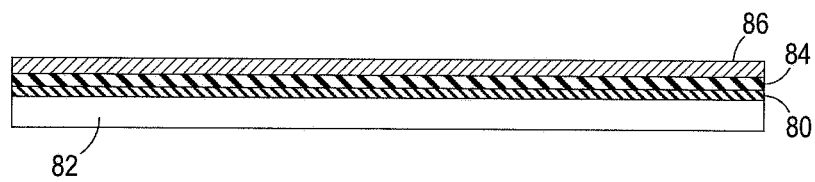
FIGS. 9 and 10 are cross sections depicting another embodiment of the present teachings to form a piezoelectric ink jet printhead.
Figure 10:
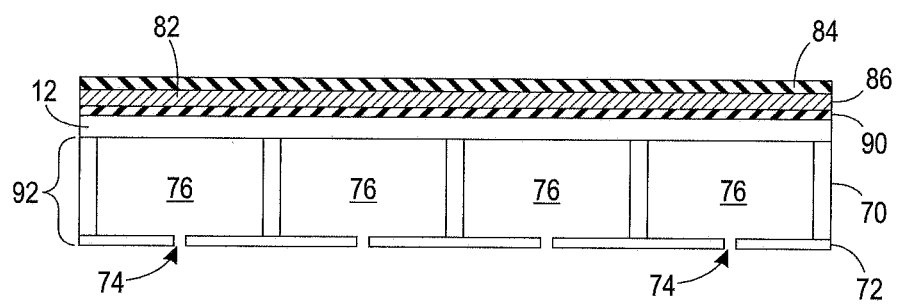

Various modifications to the structure and process described above will be evident from the disclosure herein. For example, as depicted in FIG. 9, a release layer 80 may be formed over a substrate 82, and a top electrode layer 84 may be formed on the release layer 80. Subsequently, a piezoelectric composite 86, including one or more individual piezoelectric layers, may be formed on the top electrode layer 84, for example, using a process as described above.

Subsequently, the top electrode layer 84 and the piezoelectric composite 86 may be released from the substrate 82, for example, by dissolving a dissolvable release layer 80 in a solvent, or by heating and flowing the release layer 80 if the release layer 80 is a thermoplastic. The piezoelectric composite 86 may then be bonded to a diaphragm 12 using, for example, an adhesive 90 or other bonding technique. In an embodiment, the diaphragm 12 may be part of a completed jet stack 92 during attachment of the top electrode layer 84 and the piezoelectric composite 86. In another embodiment, the diaphragm 12, top electrode layer 84, and piezoelectric composite 86 may be subsequently attached to the jet stack 92. In either case, processing can continue to form individual top electrodes 50 and actuators 60, for example depicted in FIG. 8, and other drive electronics.

In an embodiment, the exposed surface of the diaphragm 12 of FIG. 2 can be treated or cleaned to enhance the contact bond between the diaphragm 12 and the cured piezoelectric sol-gel solution 10. In an embodiment, the exposed surface of the diaphragm 12 can be chemically treated using, for example, one or more solvents, detergents, or a mild etchant. In another embodiment, the exposed surface of the diaphragm 12 can be treated through exposure to plasma such as an oxygen plasma and/or reducing gases including hydrogen. In another embodiment, the exposed surface of the diaphragm 12 can be treated using an ultrasonic cleaning process, or treated using a polishing process such as a chemical, a mechanical, or a chemical-mechanical polishing process. In another embodiment, an optional adhesion layer, a buffer layer, or a surface energy modification layer can be formed over the exposed surface of the diaphragm 12 prior to applying or dispensing the sol-gel layer 10 to the diaphragm 12. One or more of these treatments, which may be represented by layer 80 in FIG. 9, for example, can be performed either before or after attachment to the chuck 16 of the spin coating apparatus 14.

It will be appreciated that other processing stages may be performed instead of, or in addition to, the embodiments listed above. For example, various printhead structures may be positioned in a stack press to enhance or facilitate physical and/or electrical attachment of various printhead layers. The completed printhead may include other ink chambers, ink paths, ink reservoirs, electrical structures that serve as drive electronics, or other electrical or mechanical structures related to the functionality, appearance, or attachment of the printhead.

Figure 11:
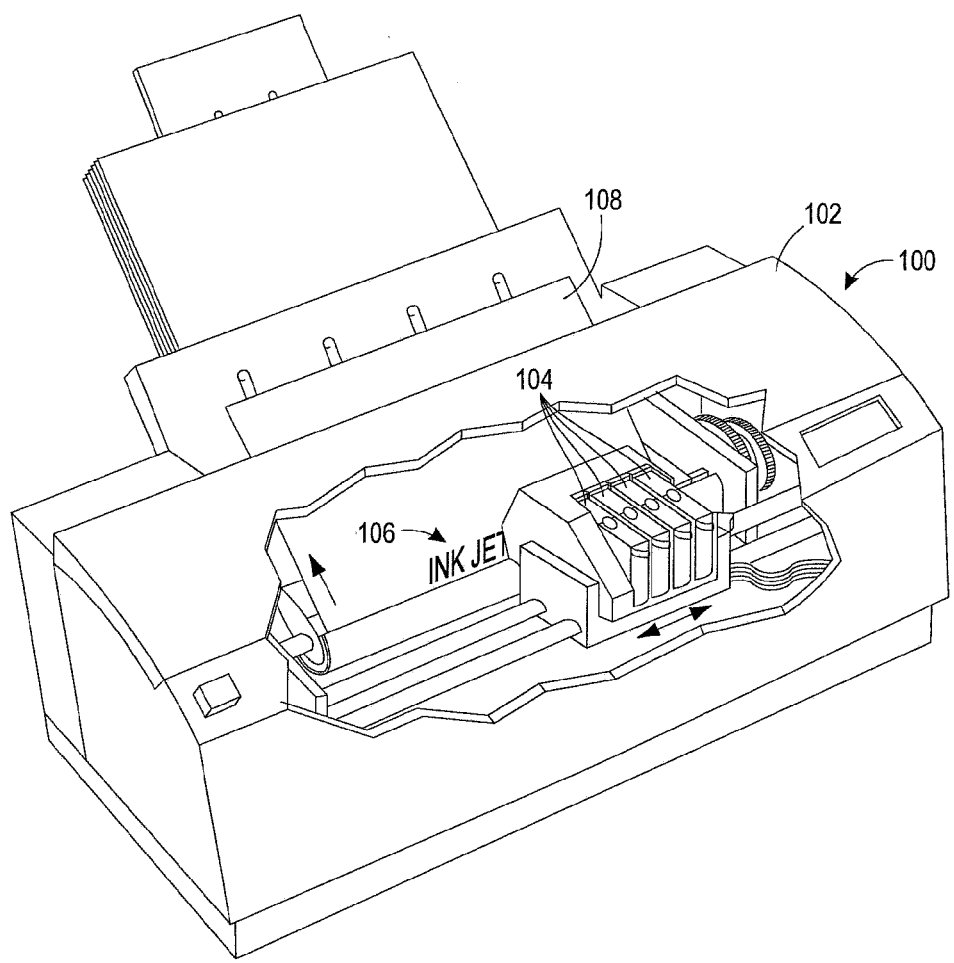
FIG. 11 is a perspective depiction of a printer including a printhead according to an embodiment of the present teachings.

FIG. 11 depicts a printer 100 including a printer housing 102 into which at least one printhead 104 including an embodiment of the present teachings has been installed. The housing 102 may encase the printhead 104. During operation, ink 106 is ejected from one or more printheads 104. The printhead 104 is operated in accordance with digital instructions to create a desired image on a print medium 108 such as a paper sheet, plastic, etc. The printhead 104 may move back and forth relative to the print medium 108 in a scanning motion to generate the printed image swath by swath. Alternately, the printhead 104 may be held fixed and the print medium 108 moved relative to it, creating an image as wide as the printhead 104 in a single pass. The printhead 104 can be narrower than, or as wide as, the print medium 108. In another embodiment, the printhead 104 can print to an intermediate surface such as a rotating drum or belt (not depicted for simplicity) for subsequent transfer to a print medium.

Some portions of the detailed description herein are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems is apparent from the description above. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

The methods illustrated throughout the specification, may be implemented in a computer program product that may be executed on a computer. The computer program product may comprise a non-transitory computer-readable recording medium on which a control program is recorded, such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A piezoelectric ink-jet printhead comprising:
   a plurality of ink ejectors including,
      a nozzle;
      an ink chamber;
      at least one body chamber;
      at least one diaphragm material, wherein the diaphragm material consists of a foil with built up piezoelectric material, configured such that the deflection of the diaphragm on the at least one body chamber contributes to a pressure pulse that is used to eject a drop of liquid from the nozzle; and
      a top electrode, the top electrode being individually addressable through drive electronics in electrical communication with the top electrode;
   wherein the piezoelectric material is built up in multiple layers.

2. The piezoelectric ink-jet printhead of claim 1, wherein the piezoelectric material on the at least one diaphragm is formed prior to lamination.

3. The piezoelectric ink-jet printhead of claim 1, wherein the piezoelectric material is oriented.

4. The piezoelectric ink-jet printhead of claim 1, wherein the piezoelectric material is patterned.

5. The piezoelectric ink-jet printhead of claim 1, wherein the piezoelectric material is between 0.5 µm and 25 µm in thickness.

6. The piezoelectric ink-jet printhead of claim 1, wherein the at least one diaphragm material is between 0.5 µm and 30 µm in thickness.

7. The piezoelectric ink-jet printhead of claim 1, wherein the at least one diaphragm material is a metal foil.

8. The piezoelectric ink-jet printhead of claim 1, wherein the at least one diaphragm material is a stainless steel foil.

9. The piezoelectric ink-jet printhead of claim 1, wherein conductive regions are positioned opposite to each at least one diaphragm material and a voltage is applied to said conductive regions to induce an piezoelectric force that causes deflections in said at least one diaphragm.

10. The piezoelectric ink-jet printhead of claim 1, wherein the built up piezoelectric material is a piezoelectric composite consisting of from about 5 to about 500 layers of piezoelectric material.

11. A piezoelectric ink-jet printhead comprising:
   a plurality of ink ejectors including,
      a nozzle;
      an ink chamber;
      at least one body chamber;
      at least one diaphragm material, wherein the diaphragm consists of a foil with built up piezoelectric material, configured such that the deflection of the diaphragm on the at least one body chamber contributes to a pressure pulse that is used to eject a drop of liquid from the nozzle; and
      a top electrode, the top electrode individually addressable through drive electronics in electrical communication with the top electrode;
   wherein the built up piezoelectric material is built up in multiple layers; and
   wherein the piezoelectric printhead is formed by depositing a liquid sol-gel solution comprising a piezoelectric material over a substrate;
   curing the liquid sol-gel solution on the substrate to form a cured piezoelectric composite; and
   forming an actuator array for the ink jet printhead from the piezoelectric composite, wherein the actuator array comprises a plurality of individually addressable actuators.

12. The piezoelectric ink-jet printhead of claim 11, wherein the substrate is a printhead diaphragm and the piezoelectric ink-jet printhead is further formed by attaching the printhead diaphragm to a printhead jet stack.

13. The piezoelectric ink-jet printhead of claim 12, further comprising:
an electrically conductive top electrode layer over the substrate, wherein the liquid sol-gel solution is first deposited over the substrate and onto the top electrode layer, the cured piezoelectric composite is attached to the top electrode layer to a printhead diaphragm and the cured piezoelectric composite and the top electrode layer is removed from the substrate.

14. The piezoelectric ink-jet printhead of claim 12, wherein the piezoelectric material on the at least one diaphragm is formed prior to lamination.

15. The piezoelectric ink-jet printhead of claim 12, wherein the piezoelectric material is patterned.

16. The piezoelectric ink-jet printhead of claim 12, wherein the piezoelectric material is between 0.5 µm and 25 µm in thickness and the at least one diaphragm material is between 0.5 urn and 30 µm in thickness.

17. The piezoelectric ink-jet printhead of claim 12, wherein the at least one diaphragm material is a metal foil.

18. The piezoelectric ink-jet printhead of claim 11, wherein the deposition and curing of the liquid sol-gel solution steps are repeated to form a piezoelectric composite consisting of from about 5 to about 500 layers of the piezoelectric material.

19. A method for fabricating BNKT-BMT thick hybrid films, the method comprising:
deposition of a BNKT-BMT paste on a stainless steel membrane substrate, wherein the deposited BNKT-BMT paste is then cured; and
infiltration of the BNKT-BMT paste using the same composition as the BNKT-BMT paste, wherein the infiltrated BNKT-BMT paste is cured, wherein after a plurality of infiltrations and curing cycles, a thick hybrid film is annealed at 650° C.–800° C. for 30 minutes to 2 hours with a final thickness in the range of 5 µm-50 µm.

20. The method of claim 19, wherein the cured deposited BNKT-BMT paste is cured at 250° C.-600° C. for 15 minutes to 1 hour and the cured infiltration of the BNKT-BMT paste is cured at 250° C.-600° C. for 5-20 minutes.

* * * * *